United States Patent
Hsiao et al.

(10) Patent No.: US 8,389,377 B2
(45) Date of Patent: Mar. 5, 2013

(54) SENSOR ELEMENT ISOLATION IN A BACKSIDE ILLUMINATED IMAGE SENSOR

(75) Inventors: Ru-Shang Hsiao, Jhubei (TW); Kun-Yu Tsai, Taipei (TW); Chien-Hsien Tseng, Hsin-Chu (TW); Shou-Gwo Wuu, Hsin-Chu (TW); Nai-Wen Cheng, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 278 days.

(21) Appl. No.: 12/753,440

(22) Filed: Apr. 2, 2010

(65) Prior Publication Data

US 2011/0241152 A1 Oct. 6, 2011

(51) Int. Cl.
 *H01L 21/76* (2006.01)
(52) U.S. Cl. .......... 438/433; 438/57; 438/423; 438/424; 257/506
(58) Field of Classification Search ............ 438/57, 438/423, 525, 426, 407, 424, 433; 257/506, 257/524
See application file for complete search history.

(56) References Cited

U.S. PATENT DOCUMENTS

| | | | | |
|---|---|---|---|---|
| 5,994,200 A | * | 11/1999 | Kim | 438/425 |
| 7,176,104 B1 | * | 2/2007 | Chen et al. | 438/424 |
| 7,217,589 B2 | * | 5/2007 | Rhodes et al. | 438/57 |
| 7,485,940 B2 | | 2/2009 | Hsu et al. | |
| 7,518,172 B2 | * | 4/2009 | Moon et al. | 257/292 |
| 7,800,192 B2 | * | 9/2010 | Venezia et al. | 257/432 |
| 7,847,186 B2 | * | 12/2010 | Sawada et al. | 136/252 |
| 2008/0217719 A1 | * | 9/2008 | Liu et al. | 438/433 |
| 2010/0006908 A1 | | 1/2010 | Brady | |
| 2010/0038744 A1 | * | 2/2010 | Li et al. | 438/425 |
| 2010/0164035 A1 | * | 7/2010 | Kim | 257/432 |

* cited by examiner

*Primary Examiner* — Fernando L Toledo
*Assistant Examiner* — Bryan Junge
(74) *Attorney, Agent, or Firm* — Haynes and Boone, LLP (57) ABSTRACT

The present disclosure provides methods and apparatus for sensor element isolation in a backside illuminated image sensor. In one embodiment, a method of fabricating a semiconductor device includes providing a sensor layer having a frontside surface and a backside surface, forming a plurality of frontside trenches in the frontside surface of the sensor layer, and implanting oxygen into the sensor layer through the plurality of frontside trenches. The method further includes annealing the implanted oxygen to form a plurality of first silicon oxide blocks in the sensor layer, wherein each first silicon oxide block is disposed substantially adjacent a respective frontside trench to form an isolation feature. A semiconductor device fabricated by such a method is also disclosed.

18 Claims, 7 Drawing Sheets

FIG. 5

SENSOR ELEMENT ISOLATION IN A BACKSIDE ILLUMINATED IMAGE SENSOR

BACKGROUND

In semiconductor technologies, backside-illuminated sensors are used for sensing a volume of exposed light projected towards the backside surface of a substrate or sensor layer. The backside-illuminated sensors can be formed in the substrate and light projected towards the backside of the substrate can reach the sensors. However, without proper isolation, light targeted for one sensor pixel may also have a portion of the light directed toward other pixels, which can cause optical and electrical crosstalk among various sensor pixels.

Therefore, while existing methods of fabricating semiconductor devices have been generally adequate for their intended purposes, they have not been entirely satisfactory in every aspect. In particular, improvements in backside illuminated sensors and/or the corresponding substrate are desired.

BRIEF DESCRIPTION OF THE DRAWINGS

Aspects of the present disclosure are best understood from the following detailed description when read with the accompanying figures. It is emphasized that, in accordance with the standard practice in the industry, various features may not be drawn to scale. In fact, the dimensions of the various features may be arbitrarily increased or reduced for clarity of discussion.

SUMMARY

The present disclosure provides for many different embodiments. One of the broader forms of the present disclosure involves a method of fabricating a semiconductor device. The method includes providing a sensor layer having a frontside surface and a backside surface, and forming a plurality of frontside trenches in the frontside surface of the sensor layer. The method further includes implanting oxygen into the sensor layer through the plurality of frontside trenches, and annealing the implanted oxygen to form a plurality of first silicon oxide blocks in the sensor layer, wherein each first silicon oxide block is disposed substantially adjacent a respective frontside trench to form an isolation feature.

Another of the broader forms of the present disclosure involves a method of fabricating a semiconductor device. The method includes providing a sensor layer having a frontside surface and a backside surface, forming a plurality of frontside trenches in the frontside surface of the sensor layer, implanting oxygen into the sensor layer through the plurality of frontside trenches, and annealing the oxygen implanted through the plurality of frontside trenches to form a plurality of first silicon oxide blocks. The method further includes forming a plurality of backside trenches in the backside surface of the sensor layer, implanting oxygen into the sensor layer through the plurality of backside trenches, and annealing the oxygen implanted through the plurality of backside trenches to form a plurality of second silicon oxide blocks, each group of vertically-aligned first and second silicon oxide blocks substantially adjoining a vertically-aligned frontside trench and backside trench to form an isolation feature.

Yet another of the broader forms of the present disclosure involves an apparatus that includes a semiconductor device. The semiconductor device includes a sensor layer having a frontside surface and a backside surface, a plurality of photodetectors in the sensor layer, and a plurality of frontside trenches in the frontside surface of the sensor layer. The semiconductor device further includes a plurality of silicon oxide blocks, wherein each silicon oxide block is substantially adjacent to and vertically-aligned with a respective frontside trench to form an isolation feature, wherein each isolation feature is disposed between two adjacent photodetectors.

DETAILED DESCRIPTION

The present disclosure relates generally to the fabrication of a semiconductor device, and more particularly, to methods for providing sensor isolation features in a semiconductor substrate and devices fabricated by such methods.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
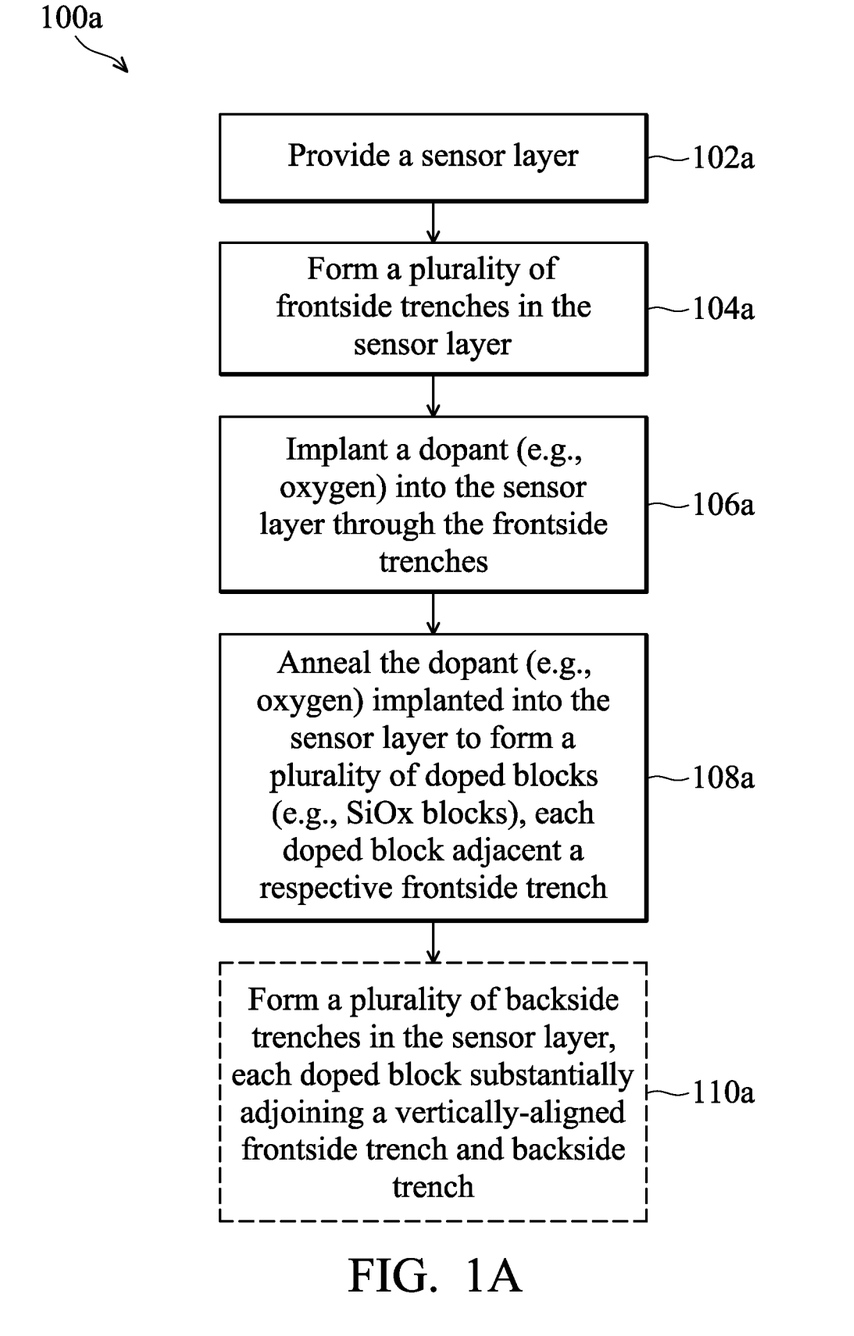
FIG. 1A is a flowchart illustrating a method of fabricating a semiconductor device according to various aspects of the present disclosure.
Figure 1B:
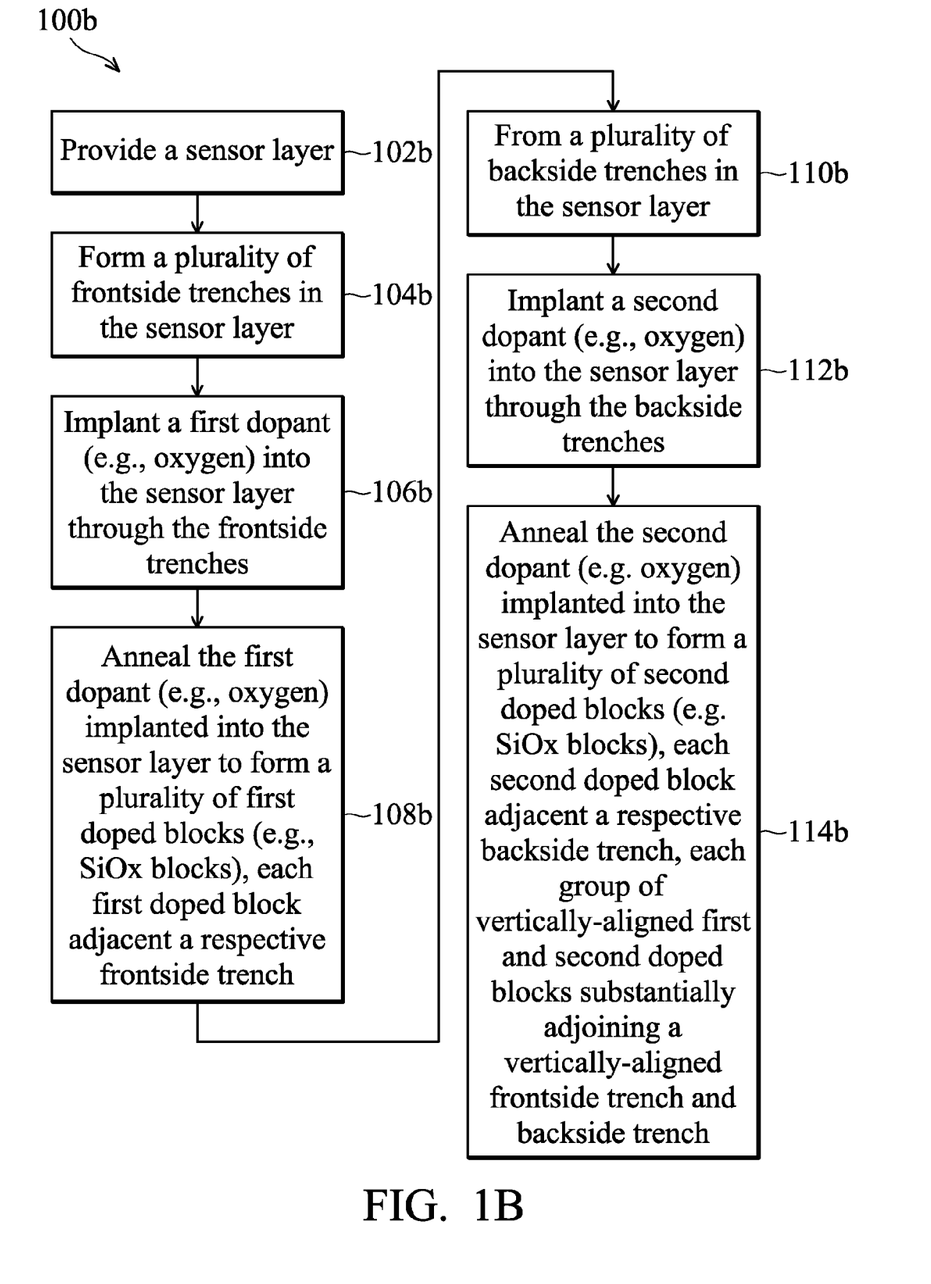
FIG. 1B is a flowchart illustrating another method of fabricating a semiconductor device according to various aspects of the present disclosure.
Figure 2A:
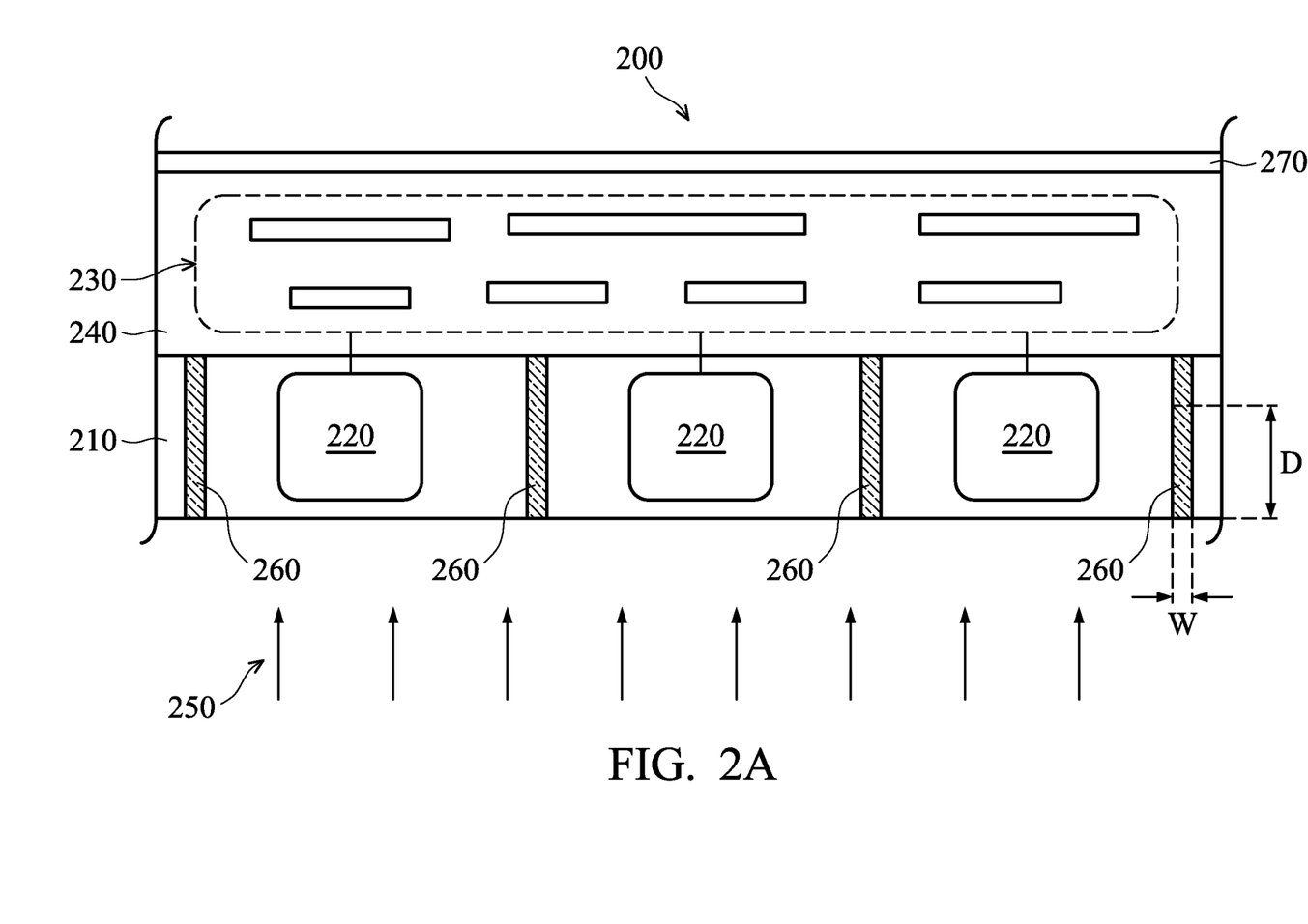
FIG. 2A illustrates a sectional view of one embodiment of a semiconductor device having a plurality of backside illuminated sensors and sensor isolation features constructed according to aspects of the present disclosure.
Figure 2B:
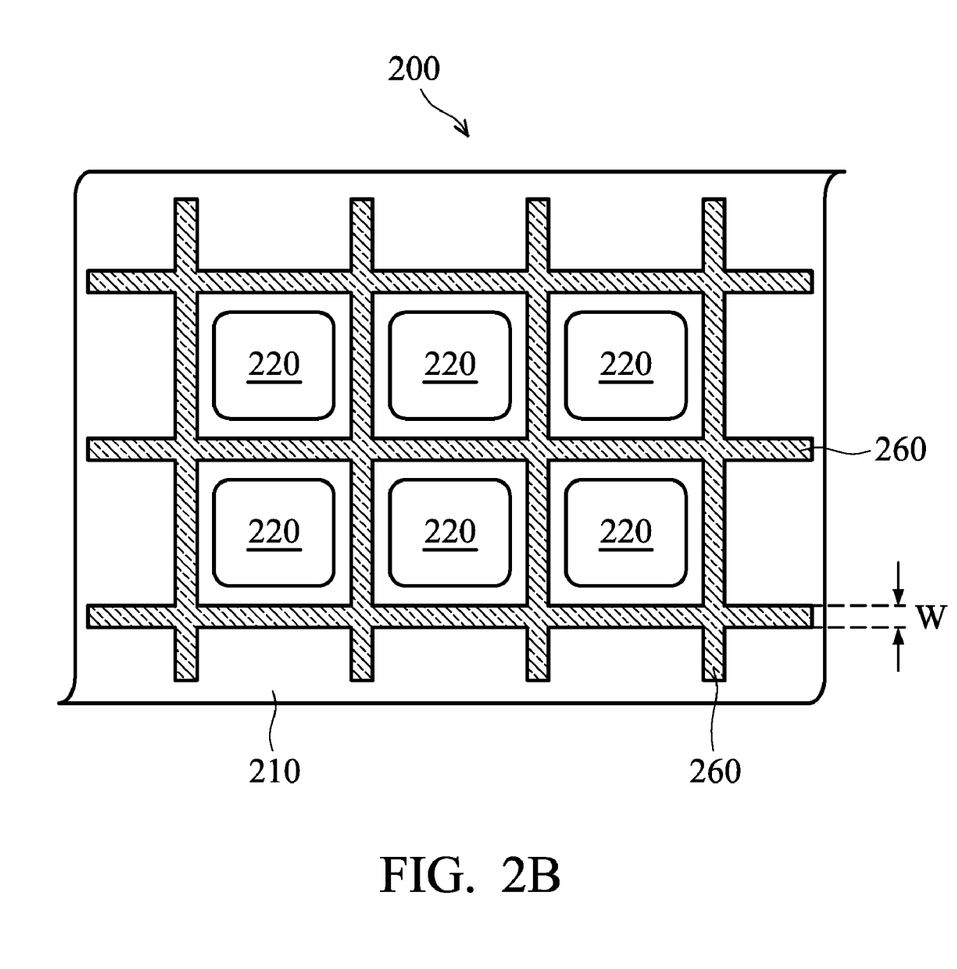
FIG. 2B illustrates a top view of one embodiment of a semiconductor device having a plurality of backside illuminated sensors and sensor isolation features constructed according to aspects of the present disclosure.
Figure 3:
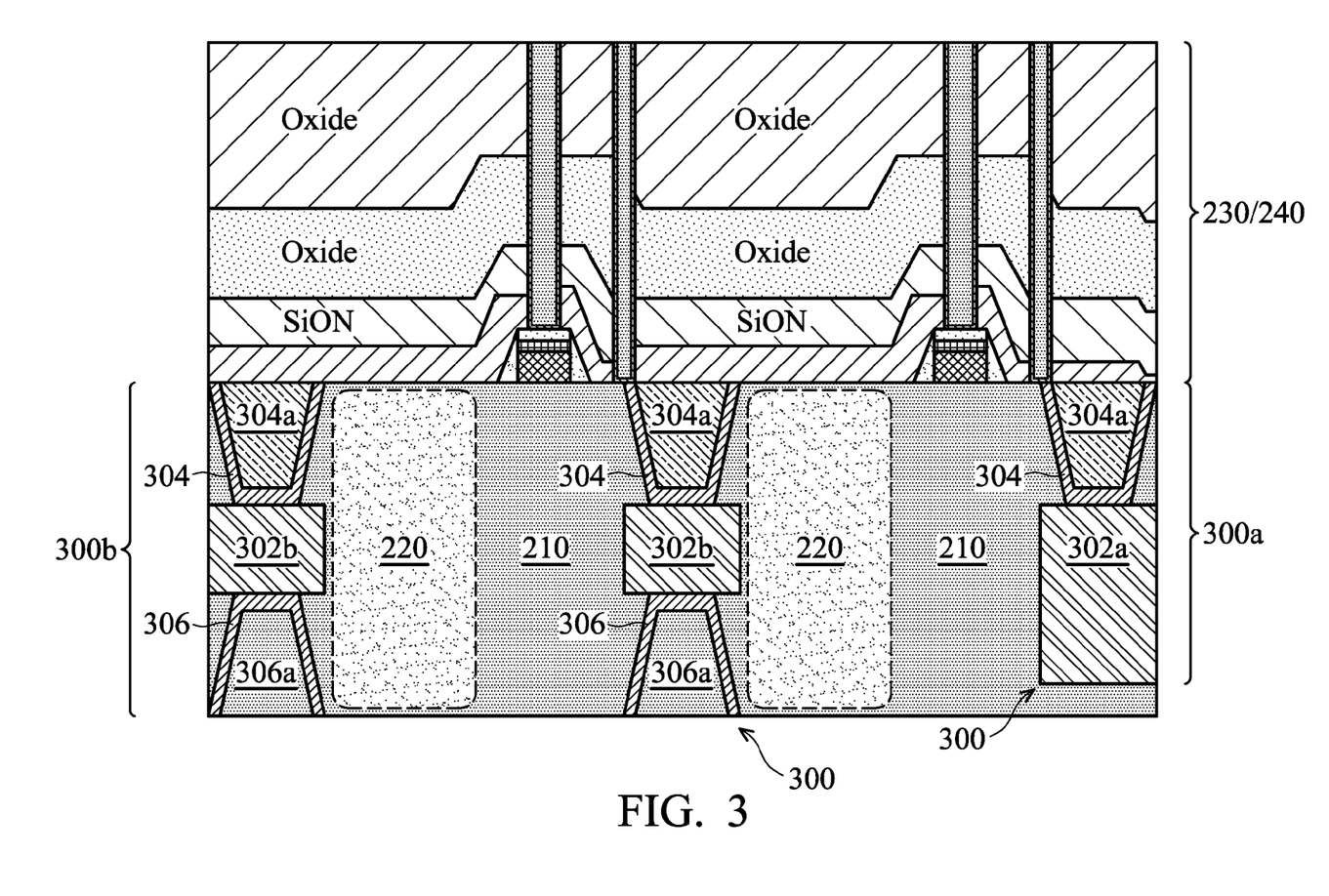
FIG. 3 illustrates a sectional view of one embodiment of a semiconductor device having a plurality of backside illuminated sensors and isolation features comprised of a silicon oxide block substantially adjoining vertically-aligned frontside and backside trenches according to various aspects of the present disclosure.
Figure 4:
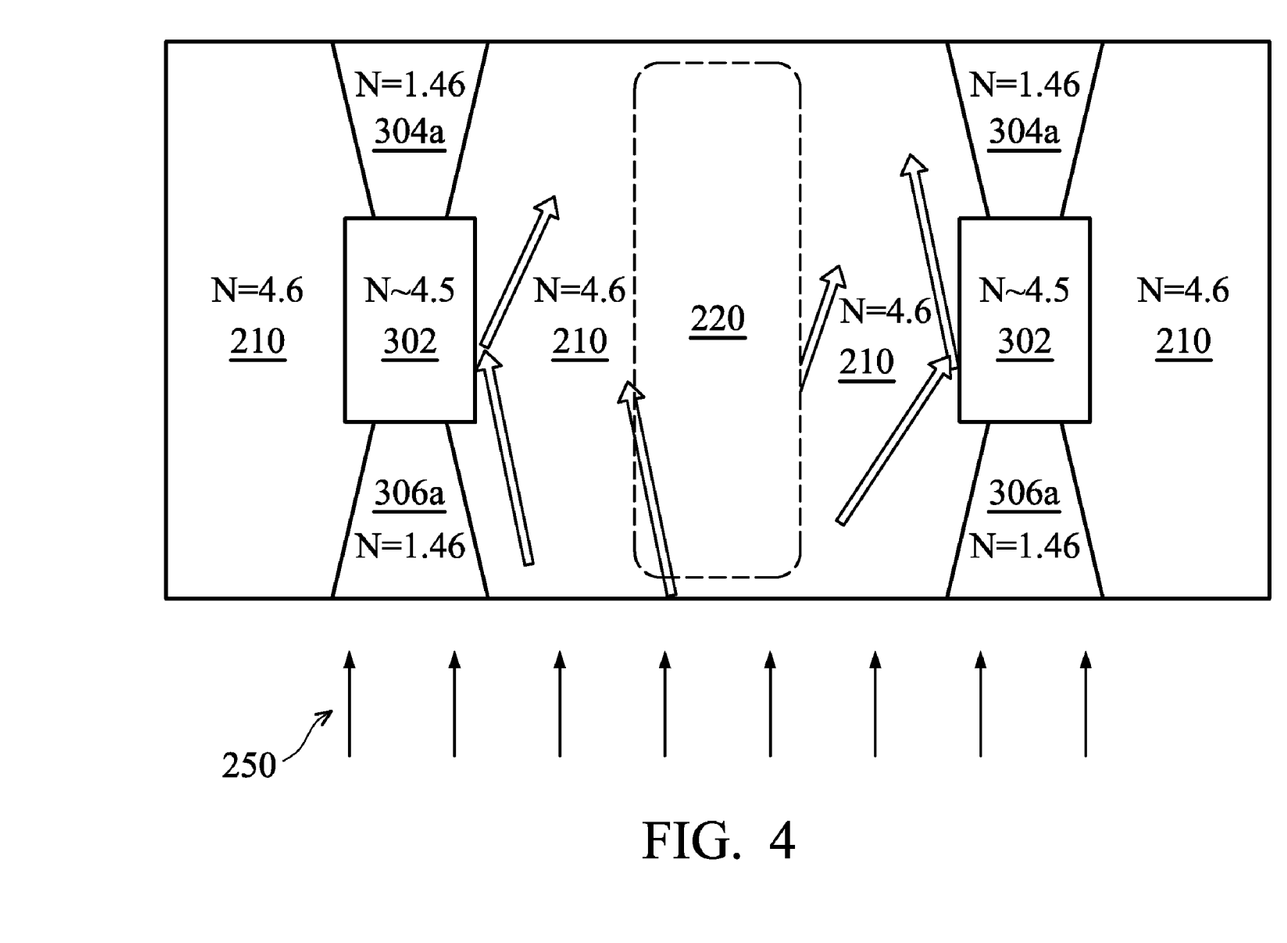
FIG. 4 illustrates the refractive indices of materials forming one embodiment of a semiconductor device including the isolation features according to various aspects of the present disclosure.
Figure 5:
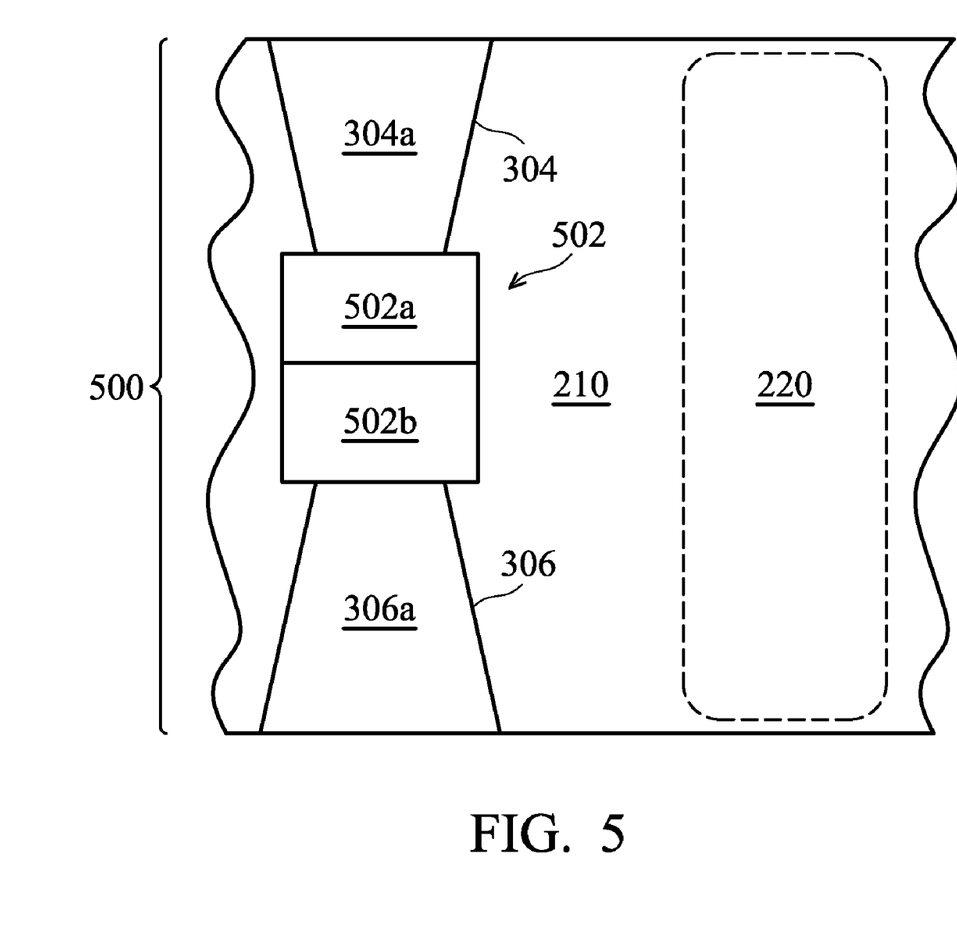
FIG. 5 illustrates a sectional view of one embodiment of a semiconductor device having another isolation feature substantially adjoining vertically-aligned frontside and backside trenches according to various aspects of the present disclosure.

Referring now to the figures, illustrated in FIGS. 1A and 1B are flowcharts of different example methods for fabricating a semiconductor device including an isolation feature. FIGS. 2A and 2B are a diagrammatic fragmentary cross-sectional side view and top view, respectively, of a semiconductor device including sensor isolation features. Illustrated in FIG. 3 is a more detailed cross-sectional side view of the semiconductor device including sensor isolation features in accordance with one embodiment, and illustrated in FIG. 4 are the refractive indices of materials forming one embodiment of a semiconductor device including the isolation features. FIG. 5 illustrates a cross-sectional side view of a semiconductor device including a sensor isolation feature in accordance with another embodiment.

The semiconductor device may include an integrated circuit (IC) chip, system on chip (SoC), or portion thereof, that may include various passive and active microelectronic devices, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, FinFET transistors, or other types of transistors. It is understood that the figures may have been simplified for a better understanding of the inventive concepts of the present disclosure. Accordingly, it should be noted that additional processes may be provided before, during, and/or after the methods of FIGS. 1A and 1B, and that some other processes may only be briefly described herein.

Referring now to FIG. 1A, a method 100a begins with block 102a in which a substrate having a frontside surface and a backside surface is provided, for example a sensor layer in which is formed sensor elements, such as photodetectors. The method 100a continues with block 104a, in which a plurality of frontside trenches are formed in the sensor layer through the frontside surface. A dopant, such as oxygen, is then implanted into the sensor layer, for example through the frontside trenches, as shown in block 106a. At block 108a, the implanted dopant (e.g., oxygen) in the sensor layer is annealed to form a plurality of doped blocks (e.g., silicon oxide blocks), with each doped block substantially adjacent to and/or vertically-aligned with a respective frontside trench. The combination of each frontside trench and doped block forms an isolation feature, which can advantageously isolate sensor elements within the sensor layer.

Optionally, as shown by dashed block 110a, a plurality of backside trenches are formed in the sensor layer through the backside surface, and in one example, the backside trenches are vertically-aligned with corresponding frontside trenches, such that each doped block substantially adjoins a vertically-aligned frontside trench and backside trench. The combination of each frontside trench, doped block, and backside trench forms another isolation feature which can advantageously isolate sensor elements within the sensor layer.

Referring now to FIG. 1B, a method 100b begins with block 102b in which a substrate having a frontside surface and a backside surface is provided, for example a sensor layer in which is formed sensor elements, such as photodetectors. The method 100b continues with block 104b, in which a plurality of frontside trenches are formed in the sensor layer through the frontside surface. A first dopant, such as oxygen, is then implanted into the sensor layer, for example through the frontside trenches, as shown in block 106b. At block 108b, the implanted dopant (e.g., oxygen) in the sensor layer is annealed to form a plurality of first doped blocks (e.g., silicon oxide blocks), with each first doped block substantially adjacent to and/or vertically-aligned with a respective frontside trench. The method continues with block 110b, in which a plurality of backside trenches are formed in the sensor layer through the backside surface. In one example, corresponding frontside trenches and backside trenches are vertically-aligned. A second dopant, such as oxygen, is then implanted into the sensor layer, for example through the backside trenches, as shown in block 112b. At block 114b, the implanted second dopant (e.g., oxygen) in the sensor layer is annealed to form a plurality of second doped blocks (e.g., silicon oxide blocks) corresponding to the trenches, with each second doped block adjacent to and/or vertically-aligned with a respective backside trench. The combination of each vertically-aligned first and second doped block substantially adjoins a vertically-aligned frontside trench and backside trench, and the combination of each frontside trench, doped first block, doped second block, and backside trench forms yet another isolation feature which can advantageously isolate sensor elements within the sensor layer.

Referring now to FIG. 2A, a sectional view of one embodiment of a semiconductor device 200 having a plurality of backside illuminated (or back-illuminated) sensors and sensor isolation features is illustrated according to aspects of the present disclosure. FIG. 2B illustrates a top view of one embodiment of the semiconductor device 200 having a plurality of backside illuminated sensors and sensor isolation features formed in the backside of the semiconductor device. Some features in FIG. 2A are not illustrated in FIG. 2B for simplicity and clarification. The semiconductor device 200 will now be described with reference to FIGS. 2A and 2B.

The semiconductor device 200 includes a semiconductor substrate 210, which may also be considered a sensor layer. The substrate 210 includes silicon. The substrate 210 may alternatively or additionally include other elementary semiconductor material such as germanium, and/or diamond. The substrate 210 may also include a compound semiconductor material such as silicon carbide, gallium arsenic, indium arsenide, and/or indium phosphide. The substrate 210 may include an alloy semiconductor such as silicon germanium, silicon germanium carbide, gallium arsenic phosphide, and/or gallium indium phosphide. The substrate 210 may include various p-type doped regions and/or n-type doped regions. All doping may be implemented using a process such as ion implantation or diffusion in various steps and techniques. The substrate 210 may include conventional isolation features, known in the art, to separate different devices formed in the substrate 210. The substrate 210 may include other features such as an epitaxial layer, a semiconductor on insulator (SOI) structure, or combinations thereof.

The semiconductor device 200 includes sensor elements 220 (or sensor pixels) formed within the semiconductor substrate 210. In one embodiment, the sensor elements 220 may each include a light-sensing region (or photo-sensing region) which may be a doped region having N-type and/or P-type dopants formed in the semiconductor substrate 210 by a method such as diffusion or ion implantation. The light-sensing region may have a doping concentration ranging between about $10^{14}$ and $10^{21}$ atoms/cm$^3$ in one example. The sensor elements 220 may include photodiodes, complimentary metal-oxide-semiconductor (CMOS) image sensors, charged coupling device (CCD) sensors, active sensor, passive sensor, and/or other sensors diffused or otherwise formed in the substrate 210. As such, the sensor elements 220 may comprise conventional and/or future-developed image sensing devices. The sensor elements 220 may include a plurality of pixels disposed in a sensor array or other proper configuration. The plurality of sensor pixels may be designed having various sensor types. For example, one group of sensor pixels are CMOS image sensors and another group of sensor pixels are passive sensors. Moreover, the sensor elements 220 may include color image sensors and/or monochromatic image sensors. In one example, the semiconductor device 200 is designed to receive light (or radiation) 250 directed towards the back surface of the semiconductor substrate 210 during applications, eliminating obstruction of the optical paths by other objects such as gate features and metal lines, and maximizing the exposure of the light-sensing region to the illuminated light. The substrate 210 may be thinned such that the light directed through the back surface thereof may effectively reach the sensor elements 220.

The semiconductor device 200 further includes a multilayer interconnect (MLI) 230 coupled to the sensor elements 220, such that the sensor elements 220 are operable to properly respond to illuminated light (imaging radiation). The multilayer interconnect (MLI) 230 may be formed on the semiconductor substrate 210 and disposed on the frontside surface overlying the sensor elements 220. The MLI 230 may include conductive materials, such as metals. In one example, metals such as aluminum, aluminum/silicon/copper alloy, titanium, titanium nitride, tungsten, polysilicon, metal silicide, or combinations thereof, may be used and are referred to as aluminum interconnects. Aluminum interconnects may be formed by a process including physical vapor deposition (or sputtering), chemical vapor deposition (CVD), or combinations thereof. Other manufacturing techniques to form the metal interconnect may include photolithography processing and etching to pattern the conductive materials for vertical (via and contact) and horizontal connects (conductive line). Still other manufacturing processes such as thermal annealing may be used to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, copper multilayer interconnect may be used and include copper, copper alloy, titanium, titanium nitride, tantalum, tantalum nitride, tungsten, polysilicon, metal silicide, or combinations thereof. The copper multilayer interconnect may be formed by a technique including CVD, sputtering, plating, or other suitable processes.

The semiconductor device 200 further includes an interlayer dielectric (inter-level dielectric or ILD) 240 to isolate the MLI 230 disposed therein. The ILD structure 240 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The ILD 240 may be formed by a technique including spin-on, CVD, sputtering, or other suitable processes. The MLI 230 and ILD 240 may be formed in an integrated process including a damascene process such as dual damascene processing or single damascene processing.

The semiconductor device 200 further includes sensor isolation features 260 formed in the substrate 210 and configured to lower or substantially eliminate optical and/or electronic crosstalk between sensor elements by isolating light (radiation, or signal) targeted for each sensor element and minimizing the light spreading into other sensor elements. Thus, optical and/or electronic crosstalk among various sensor pixels in which an electric signal may be transformed from an imaging radiation signal is reduced or substantially eliminated, and the quantum efficiency (QE) factor for the device is improved.

The sensor isolation feature 260 may be disposed vertically between the ILD 240 and the backside surface of the substrate 210 (FIG. 2A). The sensor isolation feature 260 may also be disposed horizontally between two adjacent sensor elements 220 in a top view toward the backside of the substrate (FIG. 2B). In one embodiment, as illustrated in FIG. 2B, the sensor isolation feature 260 is configured as multiple squares each including one sensor element 220. The sensor isolation feature 260 may be thin and deep in dimensions such as to occupy less area of the substrate 210 and provide efficient isolation functions. As illustrated in FIGS. 2A and 2B, the sensor isolation feature 260 may be disposed between two neighboring sensor elements and have a width ranging between about 0.1 micron and about 0.5 micron in one example. The sensor isolation feature 260 may be vertically extended substantially between the backside surface and the ILD 240. In one embodiment, the sensor isolation feature 260 may run substantially along 100% of the thickness of the semiconductor substrate 210. In other embodiments, the sensor isolation feature 260 may be vertically extended along less than 100% of the thickness of the semiconductor substrate 210. In one example, the semiconductor substrate 210 may have a thickness ranging between about 1.0 micron and about 5.0 micron for illumination and imaging efficiency, and the sensor isolation feature 260 may also have a thickness ranging between about 1.0 micron and about 5.0 micron but is not limited to such a range. The sensor isolation feature 260 may further include a plurality of portions, connected or not connected, disposed in a configuration to substantially eliminate crosstalk between two adjacent sensor elements. For example, the sensor isolation feature 260 may be designed to include a fence structure having a plurality of posts interposed between neighboring sensor elements and disposed around each sensor element.

The semiconductor device 200 may further include a passivation layer 270 disposed over the MLI 230 and ILD 240. The device 200 may further include a transparent or antireflective layer attached to the backside surface of the semiconductor substrate 210 to provide mechanical support thereof and to optically allow the backside-illuminated light to pass therethrough. The device 200 may also include color filters interposed between the sensor elements 220 and the back surface of the semiconductor substrate 210 for color imaging applications. The device 200 may include a plurality of micro-lens interposed between the sensor elements 220 and the back surface of the semiconductor substrate 210, or between the color filters and the back surface if the color filters are implemented, such that the backside-illuminated light can be focused on the light-sensing regions. The sensor isolation feature 260 may be formed by various processes compatible and integral to conventional processing technologies.

In the disclosed structure and the method to make the same, the illuminated light during applications may not be limited to a visual light beam, but can be extended to other optical light such as infrared (IR) and ultraviolet (UV), and other proper radiation beams. Accordingly, the sensor isolation feature 260 may be properly chosen and designed to effectively reflect and/or absorb the corresponding radiation beam.

Thus, in one embodiment the present disclosure provides a backside illuminated semiconductor device. In one embodiment, the device includes a substrate having a front surface and a back surface, with a plurality of sensor elements formed in the substrate. Each of the plurality of sensor elements is designed and configured to receive light directed towards the back surface. The device also includes a sensor isolation feature formed in the substrate to isolate the sensor elements from optical and/or electrical cross-talk. In one embodiment, the isolation features are disposed horizontally between two adjacent sensor elements of the plurality of sensor elements, and vertically between the back surface and the front surface.

Referring now to FIGS. 3 and 4, embodiments of an isolation feature 300 (e.g., isolation features 300a and 300b) are illustrated in greater detail in a semiconductor device having a plurality of backside illuminated sensors, in which the isolation features 300*a* and 300*b* are formed in accordance with method 100*a* of FIG. 1A. The semiconductor device includes a semiconductor substrate or sensor layer 210 having frontside and backside surfaces with sensor elements 220 disposed therein, an MLI 230 and ILD 240 structure disposed above the frontside surface of the substrate 210, and light (or radiation) 250 directed towards the backside surface of the semiconductor substrate 210 during applications, as described above.

In accordance with an embodiment of the present disclosure, isolation feature 300*a* is comprised of a doped region or block 302*a* substantially adjacent to and/or vertically-aligned with a respective frontside trench 304, and isolation feature 300*b* is comprised of a doped region or block 302*b* substantially adjoining a vertically-aligned frontside trench and backside trench. Frontside trench 304 is filled with a filler material 304*a* and backside trench 306 is filled with a filler material 306*a*.

FIG. 4 illustrates the refractive indices and isolation function of materials forming one embodiment of a semiconductor device including the frontside trench filler material 304*a*, the backside trench filler material 306*a*, doped blocks 302, and substrate 210 according to various aspects of the present disclosure.

As shown in FIGS. 3 and 4, the sensor isolation feature 300*a* may include a frontside trench 304 and a doped block 302*a*, and the sensor isolation feature 300*b* may include a frontside trench 304, a doped block 302*b*, and a backside trench 306. The frontside and backside trenches may be filled with a proper material such as air, a dielectric material, an opaque material, a metal material, or combinations thereof, and the doped region may be doped with a proper material, so as to effectively reflect the corresponding radiation beam. The dielectric material may include silicon oxide, silicon nitride, silicon oxynitride, low k material, or combinations thereof.

The frontside and backside trenches can be formed by a series of processing steps. In one embodiment, the substrate 210 is patterned to form a plurality of trenches in the frontside and backside surfaces using processes known in the art or new techniques to be developed in the future. For example, a photoresist layer may be applied on the frontside or backside surface of the substrate 210 and patterned using a lithography process. An anisotropic etching technique, such as a plasma etching process, may be employed to etch the substrate through the openings of the patterned photoresist layer and form a plurality of trenches. The trenches are then filled with a suitable material including a dielectric, an opaque material, or combinations thereof. Alternatively, the trenches may remain empty.

In one embodiment, frontside and backside trenches 304, 306 are comprised of shallow trench isolation (STI) features formed in the substrate 210, with the STI recesses being filled with a dielectric material, such as silicon dioxide having a refractive index of about 1.46. In alternative embodiments, the dielectric material of the STI features may include silicon nitride, silicon oxy-nitride, fluoride-doped silicate (FSG), and/or a low-k dielectric material known in the art.

The sensor isolation features 300 (e.g., isolation features 300*a* or 300*b*) may include respective doped blocks 302 (e.g., doped blocks 302*a* or 302*b*) having proper dopants, which may be formed by a method known in the art such as ion implantation. In one embodiment, doped block 302 includes an oxygen-doped region which is annealed to form a silicon-oxide block substantially adjacent to a frontside trench 304 (e.g., doped block 302*a*) or adjoining a vertically-aligned frontside trench 304 and backside trench 306 (e.g., doped block 302*b*).

A dopant, such as oxygen, is implanted into the sensor layer 210, for example through the frontside trenches 304. The implanted dopant (e.g., oxygen) in the sensor layer is annealed to form a plurality of doped blocks 302 (e.g., silicon oxide blocks), with each doped block substantially adjacent to and/or vertically-aligned with a respective frontside trench. The combination of each frontside trench and doped block forms an isolation feature, such as isolation feature 300*a*, which can advantageously isolate sensor elements within the sensor layer.

Optionally, a plurality of backside trenches 306 are formed in the sensor layer through the backside surface, and in one example, the backside trenches are vertically-aligned with corresponding frontside trenches, such that each doped block 302 substantially adjoins a vertically-aligned frontside trench and backside trench. The combination of each frontside trench, doped block, and backside trench forms another isolation feature, such as isolation feature 300*b*, which can advantageously isolate sensor elements within the sensor layer.

The doped block 302 may function at least to isolate each sensor element electrically and optically, and may be formed, in one example, with a doping concentration ranging between about $10^{11}$ atoms/cm$^3$ and $10^{18}$ atoms/cm$^3$ and an annealing temperature ranging between about 800 degrees Celsius and about 1500 degrees Celsius. In yet another example, doped block 302 is formed into a silicon oxide block by an oxygen implant less than $10^{18}$ atoms/cm$^3$ and annealed at a temperature less than 1350 degrees Celsius to have a refractive index between about 4.4 and about 4.6 within a semiconductor substrate having a refractive index of about 4.6. The doped block 302 may have a horizontal width ranging between about 0.1 micron and about 0.5 micron and a vertical thickness ranging between about 1.0 micron and about 5.0 microns in one example. In another example, other dopants may be used to change the refractive index of the substrate and to form the doped region in the sensor isolation feature. As illustrated in FIG. 3, doped blocks 302 may be formed to have the same vertical thickness or depth within substrate 210 (e.g., doped blocks 302*b* of isolation features 300*b*), or the doped blocks may be formed to not have the same vertical thickness or depth within substrate 210 (e.g., doped block 302*a* and 302*b*). In other words, doped blocks 302 may be formed to have uniform or non-uniform depth depending on the semiconductor device desired.

Advantageously, a silicon oxide doped block 302 is effective to suppress photoelectron leakage to neighboring pixels, and thus lowers or substantially eliminates electronic crosstalk between sensor elements. Furthermore, a doped block having a lower refractive index than the sensor layer substrate (e.g., 4.5 versus 4.6) traps light between isolation features 300 (as shown by the arrows in FIG. 4) to lower or substantially eliminate optical crosstalk while improving a QE factor of the sensor device. Further yet, because of the aforementioned advantages of silicon oxide, complete oxidation of the substrate is not required to form a doped block, thus allowing for lower implant dosage levels and annealing temperatures to thereby reduce cost and improve yield in production.

Referring now to FIG. 5, a cross-sectional side view of a semiconductor device is illustrated including a sensor isolation feature 500 formed in accordance with method 100*b* of FIG. 1B. In this embodiment, a semiconductor device includes a semiconductor substrate or sensor layer 210 having frontside and backside surfaces with sensor elements 220 disposed therein. Isolation features 500 electrically and optically isolate the sensor elements 220. MLI and ILD structures may be disposed above the frontside surface of the substrate 210, and light (or radiation) may be directed towards the backside surface of the semiconductor substrate 210 during applications, as described above with other embodiments.

In accordance with an embodiment of the present disclosure, isolation feature 500 is comprised of a first doped region or block 502a adjacent a respective frontside trench and a second doped region or block 502b adjacent a respective backside trench. The combination of the first and second doped blocks 502a and 502b provides a third doped block 502 that substantially adjoins vertically-aligned frontside trenches 304 and backside trenches 306, and the combination of a vertically-aligned frontside trench 304, first doped block 502a, second doped block 502b, and backside trench 306 comprises isolation feature 500.

Frontside trench 304 is filled with a filler material 304a and backside trench 306 is filled with a filler material 306a. Similar to the prior embodiments described above, the frontside and backside trenches may be formed by a series of processing steps (e.g., photolithography and etching techniques) and filled with a proper material such as air, a dielectric material, an opaque material, a metal material, or combinations thereof, and the doped region may be doped with a proper material, so as to effectively reflect the corresponding radiation beam. The dielectric material may include silicon oxide, silicon nitride, silicon oxynitride, low k material, or combinations thereof.

The sensor isolation feature 500 may include doped blocks 502a and 502b having proper dopants, which may be formed by a method known in the art such as ion implantation. In one embodiment, doped block 502 includes an oxygen-doped region which is annealed to form a silicon-oxide block substantially adjoining a vertically-aligned frontside trench 304 and backside trench 306.

A first dopant, such as oxygen, is implanted into the sensor layer 210, for example through the frontside trenches, and then the implanted dopant (e.g., oxygen) in the sensor layer is annealed to form a plurality of first doped blocks 502a (e.g., silicon oxide blocks), with each first doped block 502a substantially adjacent to and/or vertically-aligned with a respective frontside trench 304. A plurality of backside trenches 306 may then be formed in the sensor layer through the backside surface, and in one example, corresponding frontside trenches 304 and backside trenches 306 are vertically-aligned. A second dopant, such as oxygen, is then implanted into the sensor layer, for example through the backside trenches 306 and the implanted second dopant (e.g., oxygen) in the sensor layer is annealed to form a plurality of second doped blocks 502b (e.g., silicon oxide blocks) corresponding to the backside trenches 306. Each second doped block 502b is adjacent to and/or vertically-aligned with a respective backside trench 306. The combination of each vertically-aligned first doped block 502a and second doped block 502b substantially adjoins a vertically-aligned frontside trench 304 and backside trench 306, and the combination of each vertically-aligned frontside trench, doped first block, doped second block, and backside trench forms an isolation feature, such as isolation feature 500 which can advantageously isolate sensor elements within the sensor layer. Doped blocks 502a and 502b may be formed by similar doping concentrations and annealing temperatures of oxygen as disclosed above to have similar refractive indices as disclosed above. The width and thickness dimensions of block 502 (comprised of doped blocks 502a and 502b) may be similar to the dimensions of the doped blocks 302 disclosed above.

The present disclosure provides a method to fabricate a semiconductor device. In one embodiment, the method includes providing a sensor layer having a frontside surface and a backside surface, and forming a plurality of frontside trenches in the frontside surface of the sensor layer. The method further includes implanting oxygen into the sensor layer through the plurality of frontside trenches, and annealing the implanted oxygen to form a plurality of first silicon oxide blocks in the sensor layer, wherein each first silicon oxide block is disposed substantially adjacent a respective frontside trench to form an isolation feature.

In another embodiment, a method to fabricate a semiconductor device includes providing a sensor layer having a frontside surface and a backside surface, forming a plurality of frontside trenches in the frontside surface of the sensor layer, implanting oxygen into the sensor layer through the plurality of frontside trenches, and annealing the oxygen implanted through the plurality of frontside trenches to form a plurality of first silicon oxide blocks. The method further includes forming a plurality of backside trenches in the backside surface of the sensor layer, implanting oxygen into the sensor layer through the plurality of backside trenches, and annealing the oxygen implanted through the plurality of backside trenches to form a plurality of second silicon oxide blocks, each group of vertically-aligned first and second silicon oxide blocks substantially adjoining a vertically-aligned frontside trench and backside trench to form an isolation feature.

The present disclosure also provides a semiconductor device. In one embodiment, the semiconductor device includes a sensor layer having a frontside surface and a backside surface, a plurality of photodetectors in the sensor layer, and a plurality of frontside trenches in the frontside surface of the sensor layer. The semiconductor device further includes a plurality of silicon oxide blocks, wherein each silicon oxide block is substantially adjacent to and vertically-aligned with a respective frontside trench to form an isolation feature, wherein each isolation feature is disposed between two adjacent photodetectors. Advantageously, the collective trenches and adjoining doped region of the sensor isolation feature may function to isolate each sensor element both optically and electrically while improving the QE factor of the sensor device.

It is understood that additional processes may be performed to complete the fabrication of the semiconductor device. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, the method comprising:
   providing a sensor layer having a frontside surface and a backside surface;

forming a plurality of frontside trenches in the frontside surface of the sensor layer;

implanting oxygen into the sensor layer through the plurality of frontside trenches;

annealing the implanted oxygen to form a plurality of first silicon oxide blocks in the sensor layer, wherein each first silicon oxide block is disposed substantially adjacent a respective frontside trench to form an isolation feature, and wherein each first silicon oxide block has a refractive index less than a refractive index of the sensor layer; and forming a plurality of backside trenches in the backside surface of the sensor layer, wherein each first silicon oxide block substantially adjoins a vertically-aligned frontside trench and backside trench.

2. The method of claim 1, further comprising:

forming a plurality of backside trenches in the backside surface of the sensor layer;

implanting oxygen into the sensor layer through the backside trenches; and annealing the oxygen implanted through the backside trenches to form a plurality of second silicon oxide blocks in the sensor layer, wherein each second silicon oxide block is disposed substantially between a respective backside trench and a vertically-aligned first silicon oxide block.

3. The method of claim 1, wherein the implanting of oxygen into the sensor layer is performed at a dosage level between about $10^{11}$ atoms/cm$^3$ and about $10^{18}$ atoms/cm$^3$.

4. The method of claim 1, wherein the annealing of the implanted oxygen is performed at an annealing temperature between about 800 degrees Celsius and about 1500 degrees Celsius.

5. The method of claim 1, wherein the implanting of oxygen into the sensor layer is performed at a dosage level below about $10^{18}$ atoms/cm$^3$, and annealing of the implanted oxygen is performed at an annealing temperature below about 1350 degrees Celsius.

6. The method of claim 1, wherein each silicon oxide block has a refractive index between about 4.4 and about 4.6.

7. The method of claim 1, further comprising:

filling the frontside trenches with silicon dioxide having a refractive index of about 1.46; and filling the backside trenches with silicon dioxide having a refractive index of about 1.46.

8. The method of claim 1, further comprising:

providing a plurality of photodetectors, each photodetector of the plurality of photodetectors disposed between two adjacent isolation features.

9. A method of fabricating a semiconductor device, the method comprising:

providing a sensor layer having a frontside surface and a backside surface;

forming a plurality of frontside trenches in the frontside surface of the sensor layer;

implanting oxygen into the sensor layer through the plurality of frontside trenches;

annealing the oxygen implanted through the plurality of frontside trenches to form a plurality of first silicon oxide blocks, wherein each first silicon oxide block has a refractive index less than a refractive index of the sensor layer;

forming a plurality of backside trenches in the backside surface of the sensor layer;

implanting oxygen into the sensor layer through the plurality of backside trenches; and annealing the oxygen implanted through the plurality of backside trenches to form a plurality of second silicon oxide blocks, wherein each second silicon oxide block has a refractive index less than the refractive index of the sensor layer, each group of vertically-aligned first and second silicon oxide blocks substantially adjoining a vertically-aligned frontside trench and backside trench to form an isolation feature.

10. The method of claim 9, wherein the implanting of oxygen into the sensor layer is performed at a dosage level between about $10^{11}$ atoms/cm$^3$ and about $10^{18}$ atoms/cm$^3$ and about, and annealing of the implanted oxygen is performed at an annealing temperature between about 800 degrees Celsius and about 1500 degrees Celsius.

11. The method of claim 9, wherein the implanting of oxygen into the sensor layer is performed at a dosage level below about $10^{18}$ atoms/cm$^3$, and annealing of the implanted oxygen is performed at an annealing temperature below about 1350 degrees Celsius.

12. The method of claim 9, wherein each first and second silicon oxide block has a refractive index between about 4.4 and about 4.6.

13. The method of claim 9, further comprising:

filling the frontside trenches with silicon dioxide having a refractive index of about 1.46; and filling the backside trenches with silicon dioxide having a refractive index of about 1.46.

14. The method of claim 9, further comprising:

providing a plurality of photodetectors, each photodetector of the plurality of photodetectors disposed between two adjacent isolation features.

15. A method of fabricating a semiconductor device, the method comprising:

providing a sensor layer having a first surface and a second surface opposite the first surface;

forming a plurality of first trenches in the sensor layer, the first trenches being formed from the first surface;

implanting oxygen into the sensor layer through the first trenches in a manner so that the oxygen is implanted below the plurality of first trenches;

annealing the implanted oxygen to form a plurality of dielectric blocks that are each vertically aligned with a respective one of the first trenches, wherein at least two of the plurality of dielectric blocks have non-uniform depth in the sensor layer, and wherein each dielectric block has a refractive index less than a refractive index of the sensor layer; and forming a plurality of second trenches in the sensor layer, the second trenches being formed from the second surface, wherein each of the second trenches is vertically aligned with a respective one of the dielectric blocks.

16. The method of claim 15, further comprising:

implanting oxygen into the sensor layer through the second trenches in a manner so that the oxygen is implanted between the first and second trenches;

annealing the oxygen implanted into the sensor layer through the second trenches to form a plurality of additional dielectric blocks that are each vertically aligned with, and disposed in between, respective ones of the first and second trenches.

17. The method of claim 15, further comprising: forming a plurality of radiation-sensing regions in the sensor layer, wherein the radiation-sensing regions are each operable to sense a radiation wave that enters the sensor layer through the second surface.

18. The method of claim 15, wherein:

the implanting of oxygen into the sensor layer is carried out using an implant dosage level in a range from about $10^{11}$ atoms/cm$^3$ to about $10^{18}$ atoms/cm$^3$; and the annealing of the implanted oxygen is carried out at an annealing temperature in a range from about 800 degrees Celsius to about 1500 degrees Celsius.

* * * * *